United States Patent
Barton et al.

(10) Patent No.: US 12,064,845 B2
(45) Date of Patent: *Aug. 20, 2024

(54) FORMULATIONS FOR CHEMICAL MECHANICAL POLISHING PADS WITH HIGH PLANARIZATION EFFICIENCY AND CMP PADS MADE THEREWITH

(71) Applicant: Rohm and Haas Electronic Materials CMP Holdings, Inc., Newark, DE (US)

(72) Inventors: Bryan E. Barton, Lincoln University, PA (US); Teresa Brugarolas Brufau, Philadelphia, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 686 days.

This patent is subject to a terminal disclaimer.

(21) Appl. No.: 17/154,682

(22) Filed: Jan. 21, 2021

(65) Prior Publication Data

US 2022/0226958 A1   Jul. 21, 2022

(51) Int. Cl.

| | |
|---|---|
| B24B 37/24 | (2012.01) |
| B24B 37/22 | (2012.01) |
| B24B 37/26 | (2012.01) |
| B24D 18/00 | (2006.01) |
| C08G 18/10 | (2006.01) |
| C08G 18/12 | (2006.01) |
| C08G 18/18 | (2006.01) |
| C08G 18/28 | (2006.01) |
| C08G 18/32 | (2006.01) |
| C08G 18/38 | (2006.01) |
| C08G 18/48 | (2006.01) |
| C08G 18/58 | (2006.01) |
| C08G 18/65 | (2006.01) |
| C08G 18/66 | (2006.01) |
| C08G 18/76 | (2006.01) |
| C08G 18/80 | (2006.01) |
| H01L 21/306 | (2006.01) |

(52) U.S. Cl.
CPC .............. *B24B 37/24* (2013.01); *B24B 37/22* (2013.01); *B24B 37/26* (2013.01); *B24D 18/0009* (2013.01); *C08G 18/10* (2013.01); *C08G 18/12* (2013.01); *C08G 18/1808* (2013.01); *C08G 18/2835* (2013.01); *C08G 18/3203* (2013.01); *C08G 18/3206* (2013.01); *C08G 18/3225* (2013.01); *C08G 18/324* (2013.01); *C08G 18/3857* (2013.01); *C08G 18/3868* (2013.01); *C08G 18/4808* (2013.01); *C08G 18/4825* (2013.01); *C08G 18/4829* (2013.01); *C08G 18/4841* (2013.01); *C08G 18/4854* (2013.01); *C08G 18/58* (2013.01); *C08G 18/6511* (2013.01); *C08G 18/6674* (2013.01); *C08G 18/6685* (2013.01); *C08G 18/76* (2013.01); *C08G 18/7671* (2013.01); *C08G 18/8019* (2013.01); *H01L 21/30625* (2013.01)

(58) Field of Classification Search
CPC ......... B24B 37/24; B24B 37/22; B24B 37/26; C08G 18/12; C08G 18/1808; C08G 18/3206; C08G 18/58; C08G 18/6511; C08G 18/7671; C08G 18/2835; C08G 18/324; C08G 18/3857; C08G 18/4808; C08G 18/4841; C08G 18/4854; C08G 18/6685; C08G 18/8019; C08G 18/3868; C08G 18/4829; C08G 18/6674; C08G 18/10; C08G 18/3203; C08G 18/3225; C08G 18/4825; C08G 18/76; H01L 21/30625; B24D 18/0009
See application file for complete search history.

(56) References Cited

U.S. PATENT DOCUMENTS

| | | | |
|---|---|---|---|
| 2009/0062414 A1 | 3/2009 | Huang et al. | |
| 2014/0038503 A1* | 2/2014 | Itoyama | C08J 9/12 451/526 |
| 2018/0148537 A1 | 5/2018 | Barton et al. | |
| 2018/0169827 A1* | 6/2018 | Smith | B24B 37/24 |
| 2020/0391344 A1* | 12/2020 | Joeng | C08G 18/758 |
| 2021/0008687 A1 | 1/2021 | Ma et al. | |

FOREIGN PATENT DOCUMENTS

JP    5939963    6/2014

OTHER PUBLICATIONS

Search report for corresponding Chinese Application No. 202210057231.0 dated Oct. 25, 2023.

* cited by examiner

*Primary Examiner* — Rabon A Sergent
(74) *Attorney, Agent, or Firm* — Blake T. Biederman; Simon L. Xu

(57) ABSTRACT

CMP polishing pads or layers made from a polyurethane reaction product of a reaction mixture comprising (i) a liquid aromatic isocyanate component comprising one or more aromatic diisocyanates or a linear aromatic isocyanate-terminated urethane prepolymer, and (ii) a liquid polyol component comprising a) one or more polymeric polyols, b) from 12 to 40 wt. %, based on the total weight of the liquid polyol component, of a curative mixture of one or more small chain difunctional polyols having from 2 to 9 carbon atoms, a liquid aromatic diamine, wherein the mole ratio of liquid aromatic diamine to the total moles of small chain difunctional polyols and liquid aromatic diamine ranges from 15:85 to 40:60, wherein, the reaction mixture comprises 48 to 68 wt. % hard segment materials.

10 Claims, No Drawings

FORMULATIONS FOR CHEMICAL MECHANICAL POLISHING PADS WITH HIGH PLANARIZATION EFFICIENCY AND CMP PADS MADE THEREWITH

The present invention relates to chemical mechanical planarization polishing (CMP polishing) pads and methods for making them. More particularly, the present invention relates to CMP polishing pads which are the polyurethane reaction product of a two-component reaction mixture comprising a liquid aromatic diisocyanate component and a liquid polyol component comprising a monoalkylene diol, such as ethylene glycol and a liquid aromatic diamine curative.

In a CMP process, a polishing pad in combination with a polishing solution, such as an abrasive-containing polishing slurry and/or an abrasive-free reactive liquid, removes excess material in a manner that planarizes or maintains flatness of a semiconductor, optical or magnetic substrate. There is an ongoing need for CMP polishing pads that have increased layer uniformity or planarization performance in combination with acceptable removal rate. However, there has remained in the industry a performance tradeoff between planarization efficiency (PE) and defectivity with greater PE resulting in more defects. Known CMP polishing pads are formed from reaction mixtures comprising an aromatic diamine as a curative. Higher concentrations of aromatic diamines impart faster reaction times and better mechanical properties like high tensile strength, high tensile modulus. However, while such CMP polishing pads having a high tensile modulus and hardness may give good planarization efficiency, there remains a tradeoff in increased defects caused in polishing.

U.S. patent publication no. 2009/0062414A1, to Huang et al. discloses CMP polishing pads made by frothing an aliphatic isocyanate containing urethane prepolymer with an inert gas in the presence of a polysiloxane-polyalkyleneoxide surfactant and curing the froth with a curative that includes an aromatic diamine and a triol. The resulting CMP polishing pad has improved damping performance and a density of from 0.6 to 1.0 g/cm$^3$. However, the resulting polishing pad fails to provide acceptable removal rates in polishing.

U.S. patent publication no. 20180148537, to Barton et al. discloses CMP polishing pads made by reacting a liquid aromatic isocyanate compound with a liquid polyol using a curative of one or more polyamine or diamine. However, this reference fails to recognize the criticality of blending a short-chain polyol with a diamine in impacting the resulting polishing pad in planarization efficiency.

The present inventors have sought to solve the problem of providing a more flexible formulation window for making chemical mechanical polishing layers or pads useful for polishing dielectric and silicon oxide substrates and that retain good removal rate and planarization efficiency (PE) performance without an undesirable increase in defectivity and hardness.

STATEMENT OF THE INVENTION

1. In accordance with the present invention, chemical mechanical polishing (CMP polishing) pads for polishing a substrate chosen from at least one of a magnetic substrate, an optical substrate and a semiconductor substrate comprise a polishing layer adapted for polishing the substrate comprise the polyurethane reaction product of a substantially water free and organic solvent free two component reaction mixture comprising (i) a liquid aromatic isocyanate component comprising one or more aromatic diisocyanates or a linear aromatic isocyanate-terminated urethane prepolymer having an unreacted isocyanate (NCO) concentration of from 20 to 40 wt. %, or, preferably, from 18 to 34 wt. %, based on the total solids weight of the liquid aromatic isocyanate component, preferably a linear methylene diphenyl diisocyanate (MDI) prepolymer and (ii) liquid polyol component comprising a) one or more polymeric polyols, such as polytetramethylene glycol (PTMEG), polypropylene glycol (PPG), a polyol having from 5 to 7 hydroxyl groups, such as a hexafunctional polyol, or mixtures thereof, b) from 12 to 40 wt. %, or, preferably, from 15 to 25 wt. %, based on the total weight of the liquid polyol component, of a curative mixture of one or more small chain difunctional polyols having from 2 to 9 carbon atoms, such as, for example, ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol, dipropylene glycol, tripropylene glycol and mixtures thereof, or, preferably, ethylene glycol, propylene glycol, diethylene glycol, dipropylene glycol and triethylene glycol, a liquid aromatic diamine which is a liquid under ambient conditions, for example, any chosen from dimethylthio-toluene diamines, diethyl toluene diamines; tert-butyl toluene diamines, such as 5-tert-butyl-2,4- or 3-tert-butyl-2,6-toluenediamine; chlorotoluenediamines; and N,N'-dialkylaminodiphenylmethane and mixtures thereof, or, preferably, chlorotoluenediamines or dimethylthio-toluene diamines, diethyltoluenediamine (DETDA) and N,N'-dialkylaminodiphenylmethane, wherein the mole ratio of liquid aromatic diamine to the total moles of small chain difunctional polyols and liquid aromatic diamine ranges from 15:85 to 40:60, or, preferably, from 23:77 to 35:65, and, further wherein, the reaction mixture comprises 48 to 68 wt. % or, preferably, from 58 to 63 wt. % of hard segment materials, based on the total weight of the reaction mixture, and, yet still further wherein, the CMP polishing layer has a hardness in the range of from 50 Shore A (15 second) to 68 Shore D (15 second), or, preferably, from 55 Shore A (15 second) to 50 Shore D (15 second), and a density of from 0.45 to 0.9 g/mL or, preferably, from 0.60 to 0.85 g/mL; preferably, even further wherein the CMP polishing layer is free of microelements other than those formed by gas, water or a $CO_2$-amine adduct.

2. In accordance with the present invention, organic solvent free reaction mixtures for forming a chemical mechanical polishing (CMP polishing) layer as in item 1, above, wherein the (i) liquid aromatic isocyanate component comprises a liquid aromatic isocyanate component chosen from methylene diphenyl diisocyanate (MDI); toluene diisocyanate (TDI); napthalene diisocyanate (NDI); paraphenylene diisocyanate (PPDI); or o-toluidine diisocyanate (TODI); a modified diphenylmethane diisocyanate, such as a carbodiimide-modified diphenylmethane diisocyanate, an allophanate-modified diphenylmethane diisocyanate, a biuret-modified diphenylmethane diisocyanate; a linear isocyanate-terminated urethane prepolymer having a hard segment weight fraction of 84 to 100 wt. % or, preferably, from 90 to 100 wt. %, or, more preferably, MDI or a linear isocyanate-terminated urethane prepolymer of MDI or an MDI dimer with one or more isocyanate extenders chosen from ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol, dipropylene glycol, tripropylene glycol and mixtures thereof.

3. In accordance with the present invention, organic solvent free reaction mixtures for forming a chemical mechanical polishing (CMP polishing) layer as in any one of items 1 or 2, above, wherein the ii) b) curative mixture comprises the one or more small chain difunctional polyols having from 2 to 9 carbon atoms and a liquid aromatic diamine chosen from dimethylthio-toluene diamines, a mixture of the isomer 2,4-diamino-3,5-dimethylthiotoluene; 3,5-dimethylthio-2,4-toluenediamine; diethyl toluene diamines; tert-butyl toluene diamines, such as 5-tert-butyl-2,4- or 3-tert-butyl-2,6-toluenediamine; chlorotoluenediamines; and N,N'-dialkylaminodiphenylmethane and mixtures thereof, or, preferably, chlorotoluenediamines or dimethylthio-toluene diamines, a mixture of the isomers 2,4-diamino-3,5-dimethylthiotoluene and 3,5-dimethylthio-2,4-toluenediamine diethyltoluenediamine (DETDA) and N,N'-dialkylaminodiphenylmethane.

4. In accordance with the present invention, organic solvent free reaction mixtures for forming a chemical mechanical polishing (CMP polishing) layer as in any one of items 1, 2, or 3, above, wherein, the stoichiometric ratio of the sum of the total moles of amine ($NH_2$) groups and the total moles of hydroxyl (OH) groups in the reaction mixture to the total moles of unreacted isocyanate (NCO) groups in the reaction mixture ranges from 0.85:1.0 to 1.15:1.0, or, preferably, from 0.9:1.0 to 1.1:1.0.

5. In accordance with the chemical mechanical polishing pad of present invention as in any one of items 1, 2, 3, or 4, above, wherein the polishing pad or polishing layer has a density of from 0.45 to 0.9 g/mL or, preferably, from 0.60 to 0.85 g/mL formed from c) water or $CO_2$-amine adduct in the ii) liquid polyol component.

6. In accordance with the chemical mechanical polishing pad of the present invention as in any one of items 1, 2, 3, 4 or 5, above, the polishing pad further comprising a subpad or backing layer such as a polymer impregnated non-woven, or polymer sheet, onto bottom side of a polishing layer so that the polishing layer forms the top of the polishing pad.

7. In yet another aspect, the present invention provides methods for making chemical mechanical (CMP) polishing pads having a polishing layer adapted for polishing a substrate comprising providing the two component reaction mixture as in any one of items 1, 2, 3, 4, 5, or 6, above, including in the ii) liquid polyol component c) water or $CO_2$-amine adduct, such as $CO_2$-alkanolamine, sufficient to create the density of the CMP polishing pad or layer, such as from 250 to 3000 ppm, or, preferably, from 500 to 2,000 ppm of water or from 0.05 to 2 wt. %, or, preferably, from 0.1 to 1.5 wt. %, based on the total weight of the two component reaction mixture, mixing the (i) liquid aromatic isocyanate component and the (ii) liquid polyol component, such as, for example, in a static mixer or an impingement mixer, and applying the reaction mixture as one component to an open mold surface, preferably, having a male topography that forms a female groove pattern in the top surface of a CMP polishing pad or layer, curing the reaction mixture at from ambient temperature to 130° C. to form a molded polyurethane reaction product, for example, initially curing at from ambient temperature to 130° C. for a period of from 1 to 30 minutes, or, preferably, from 30 seconds to 5 minutes, removing the polyurethane reaction product from the mold, and, then, finally curing at a temperature from 60 to 130° C. for a period of 1 minutes to 18 hours, or preferably from 5 min to 60 minutes to form the CMP polishing pad or layer.

8. In accordance with the methods of the present invention as in item 7, above, wherein the forming of the polishing pad further comprises stacking or spraying a subpad layer, such as a polymer impregnated non-woven, or porous or non-porous polymer sheet, onto bottom side of a polishing layer so that the polishing layer forms the top surface of the polishing pad.

9. In accordance with the methods of the present invention as in any one of items 7 or 8, above, wherein the methods form the surface of the CMP polishing pad directly in the mold.

10. In accordance with the methods of the present invention as in any one of items 7, 8 or 9, above, wherein the applying the reaction mixture as one component comprises overspraying the mold, followed by the curing to form a polyurethane reaction product, removing the polyurethane reaction product from the mold and then punching or cutting the perimeter of the polyurethane reaction product to the desired diameter of the CMP polishing pad.

11. In yet still another aspect, the present invention provides methods of polishing a substrate, comprising: providing a substrate selected from at least one of a magnetic substrate, an optical substrate and a semiconductor substrate, such as a dielectric or silicon oxide containing; providing a chemical mechanical (CMP) polishing pad according to any one of items 1 to 6 above; creating dynamic contact between a polishing surface of the polishing layer of the CMP polishing pad and the substrate to polish a surface of the substrate; and, conditioning of the polishing surface of the polishing pad with an abrasive conditioner.

Unless otherwise indicated, conditions of temperature and pressure are ambient temperature and standard pressure. All ranges recited are inclusive and combinable.

Unless otherwise indicated, any term containing parentheses refers, alternatively, to the whole term as if no parentheses were present and the term without them, and combinations of each alternative. Thus, the term "(poly) isocyanate" refers to isocyanate, polyisocyanate, or mixtures thereof.

For purposes of this specification, the reaction mixtures are expressed in wt. %, unless specifically noted otherwise.

All ranges are inclusive and combinable. For example, the term "a range of 50 to 3000 cPs, or 100 or more cPs" would include each of 50 to 100 cPs, 50 to 3000 cPs and 100 to 3000 cPs.

As used herein, the term "ASTM" refers to publications of ASTM International, West Conshohocken, PA.

As used herein, the term "average number of isocyanate groups" means the weighted average of the number of isocyanate groups in a mixture of aromatic isocyanate compounds. For example, a 50:50 wt. % mix of MDI (2 NCO groups) and an isocyanurate of MDI (considered as having 3 NCO groups) has an average of 2.5 isocyanate groups.

As used herein, the term "hard segment" of a polyurethane reaction product or a raw material from the (ii) liquid polyol component and (i) liquid aromatic isocyanate component refers to that portion of the indicated reaction mixture which comprises any diol, glycol, diglycol, diamine, or triamine, diisocyanate, triisocyanate, or reaction product thereof. The "hard segment" thus excludes polyethers or polyglycols, such as polyethylene glycols or polypropylene glycols, or polyoxyethylenes having three or more ether groups.

As used herein, the term "microelements other than those formed by gas, water or $CO_2$-amine adduct" means microelements chosen from hollow core polymeric materials, such as polymeric microspheres, liquid filled hollow core polymeric materials, such as fluid-filled polymeric microspheres, and fillers, such as boron nitride. Pores formed in the CMP polishing layer by gas or blowing agents that solely form gases, such as $CO_2$-amine adducts, are not considered microelements.

As used herein, the term "polyisocyanate" means any isocyanate group containing molecule containing two or more isocyanate groups.

As used herein, the term "polyurethanes" refers to polymerization products from difunctional or polyfunctional isocyanates, e.g. polyetherureas, polyisocyanurates, polyurethanes, polyureas, polyurethaneureas, copolymers thereof and mixtures thereof.

As used herein, the term "reaction mixture" includes any non-reactive additives, such as microelements and any additives to lower the hardness of a polyurethane reaction product in the CMP polishing pad according to ASTM D2240-15 (2015).

As used herein, the term "stoichiometry" of a reaction mixture refers to the ratio of molar equivalents of (free OH+free $NH_2$ groups) to free NCO groups in the reaction mixture.

As used herein, the term "SG" or "specific gravity" refers to the weight/volume ratio of a rectangular cut out of a polishing pad or layer in accordance with the present invention.

As used herein, the term "Shore D hardness" is the 15 second hardness of a given CMP polishing as measured according to ASTM D2240-15 (2015), "Standard Test Method for Rubber Property—Durometer Hardness". Hardness was measured on a Rex Hybrid hardness tester (Rex Gauge Company, Inc., Buffalo Grove, IL), equipped with a D probe. Six samples were stacked and shuffled for each hardness measurement; and each pad tested was conditioned by placing it in 50 percent relative humidity for five days at 23° C. before testing and using methodology outlined in ASTM D2240-15 (2015) to improve the repeatability of the hardness tests. In the present invention, the Shore D hardness of the polyurethane reaction product of the polishing layer or pad includes the Shore D hardness of that reaction including any additive to increase hardness. The term "Shore A" hardness refers to the same 15 second hardness measure with a larger A probe for softer materials.

As used herein, the term "solids" refers to any materials that remain in the polyurethane reaction product of the present invention; thus, solids include reactive liquids and non-volatile additives and liquids that do not volatilize upon cure. Solids exclude water and volatile solvents.

As used herein, unless otherwise indicated, the term "substantially water free" means that a given composition has no added water and that the materials going into the composition have no added water. A reaction mixture that is "substantially water free" can comprise water that is present in the raw materials, in the range of from 50 to 2000 ppm or, preferably, from 50 to 1000 ppm, or can comprise reaction water formed in a condensation reaction or vapor from ambient moisture where the reaction mixture is in use.

As used herein, unless otherwise indicated, the term "organic solvent free" means that the composition is free of any added organic solvents, and, preferably, free of any organic solvents.

As used herein, unless otherwise indicated, the term "viscosity" refers to the viscosity of a given material in neat form (100%) at a given temperature as measured using a rheometer, set at an oscillatory shear rate sweep from 0.1-100 rad/sec in a 50 mm parallel plate geometry with a 100 μm gap.

As used herein, unless otherwise indicated, the term "wt. % NCO" refers to the amount of unreacted or free isocyanate groups a given isocyanate or isocyanate-terminated urethane prepolymer composition.

As used herein, the term "wt. %" stands for weight percent.

In accordance with the present invention, the present inventors have discovered that CMP polishing pads from reaction mixtures comprising as part of a curative mixture one or more small chain difunctional polyols having from 2 to 9 carbon atoms in the liquid polyol component provide a porous CMP polishing layer with a Shore D (15 second) hardness>30 that give an attractive removal rate profile and enable polishing with low defectivity. In particular, decreasing the content of the liquid aromatic diamine and replacing a portion of this diamine with the short-chain diol leads to a surprising increase in planarization efficiency, despite a decrease the tensile properties and hardness. The increase in planarization efficiency (PE) with reduced tensile properties and hardness is surprising.

The reaction mixture of the present invention can comprise a very rapid curing composition wherein the (i) liquid aromatic isocyanate component and the (ii) liquid polyol component can gel in a gel time as short as 15 seconds at 65° C. The reaction has to be slow enough that the reaction mixture can be mixed in a static or impingement mixer. The only limit on gel time is that the reaction mixture must react slowly enough so as not to clog the mix head in which it is mixed, and to adequately fill a mold when applying it to the mold surface.

The hard segment of the reaction mixture ensures good mechanical properties. The hard segment can be 56.25 to 68 wt. % of the reaction mixture and can comprise part of both the liquid polyol component and the liquid aromatic isocyanate component.

As part of the hard segment of the reaction mixture, a (i) liquid aromatic isocyanate component is preferably methylene diphenyl diisocyanate (MDI), which is less toxic compared to toluene diisocyanate (TDI). The liquid aromatic isocyanate component can comprise a linear isocyanate-terminated urethane prepolymer formed from short chain diols like glycols and diglycols or, preferably, monoethylene glycol (MEG), dipropylene glycol (DPG), or tripropylene glycol (TPG).

Preferably, the (i) liquid aromatic isocyanate component of the present invention contains only up to 5 wt. % of aliphatic isocyanate, or, more preferably, up to 1 wt. % thereof, based on the total weight of the liquid aromatic isocyanate.

The soft segment of the reaction mixture can comprise as polymeric polyols a) one or more difunctional polyether polyols in the amount of up to 88 wt. % of the (ii) liquid polyol component. Suitable soft polyols are PTMEG and PPG. Available examples of PTMEG containing polyols are as follows: Terathane™ 2900, 2000, 1800, 1400, 1000, 650 and 250 from Invista, Wichita, KS; Polymeg™ 2900, 2000, 1000, 650 from Lyondell Chemicals, Limerick, PA; Poly-THF™ 650, 1000, 2000 from BASF Corporation, Florham Park, NJ Available examples of PPG containing polyols are as follows: Arcol™ PPG-425, 725, 1000, 1025, 2000, 2025, 3025 and 4000 from Covestro, Pittsburgh, PA; Voranol™, Voralux™, and Specflex™ product lines from Dow, Midland, MI; Multranol™, Ultracel™, Desmophen™ or Acclaim™ Polyol 12200, 8200, 6300, 4200, 2200, each from Covestro (Leverkusen, DE).

The soft segment of the reaction mixture may comprise as polymeric polyols a) one or more polyol having a polyether backbone and having from 5 to 7, preferably, 6 hydroxyl groups per molecule. Preferably, the soft segment of the reaction mixture comprises as polymeric polyols a) a mixture of one or more polyol having a polyether backbone and having from 5 to 7, preferably, 6 hydroxyl groups per molecule and a difunctional polyether polyol, or, more preferably, a mixture wherein the polyol having a polyether backbone and having from 5 to 7, preferably, 6 hydroxyl groups comprises up to 20 wt. % of the total liquid polyol component (ii).

Suitable polyols having a polyether backbone and having from 5 to 7 hydroxyl groups per molecule are available as a VORANOL™ 202 Polyol (Dow) having 5 hydroxyl groups, a number average molecular weight of 590 and a hydroxyl number of 475 mg KOH/g, a MULTRANOL™ 9185 polyol (Dow) having 6 hydroxyl groups, a number average molecular weight of 3,366 and a hydroxyl number of 100 mg KOH/g, or a VORANOL™ 4053 polyol (Dow) having an average of 6.9 hydroxyl groups, a number average molecular weight of 12,420 and a hydroxyl number of 31 mg KOH/g.

The stoichiometry of the reaction mixture of the present invention ranges from (NH+OH):NCO 0.85:1.0 to 1.15:1.0. If stoichiometry ranges above the upper limit, the polyurethane product suffers decreased elongation at break. For purpose of this specification, stoichiometry represents mole ratio of amine or hydroxyl groups to isocyanates.

The curative mixture of the present invention is a liquid comprising one or more liquid aromatic diamine and one or more small chain difunctional polyols having from 2 to 9 carbon atoms. Suitable small chain difunctional polyols having from 2 to 9 carbon atoms can be ethylene glycol, butanediol (BDO), dipropylene glycol (DPG), diethylene glycol (DEG), triethylene glycol (TEG) and mixtures thereof. However, the amount of the one or more small chain difunctional polyols having from 2 to 9 carbon atoms in the curative mixture ranges at least 15 mole % of the curative mixture. If the amount of the liquid aromatic diamine goes above 85 mole %, the resulting CMP polishing layer or pad will be hard but does not provide the desirable PE and defectivity improvement.

The hard segment of the reaction mixture of the present invention ranges above 56.25 wt. % or, preferably, at least 60 wt. % of the total reaction mixture to retain adequate tensile properties, such as modulus and adequate hardness for use as hard top pads that exhibit a high PE.

The liquid reaction mixtures of the present invention enable the provision of CMP polishing pads from methods of spraying a reaction mixture onto an open mold and allowing it to cure. The two-component polyurethane forming reaction mixture of the present invention is liquid and can be mixed in a static mixer or an impingement mixer and sprayed to form a CMP polishing pad.

The chemical mechanical polishing pads of the present invention comprise a polishing layer which is a homogenous dispersion of a porous polyurethane. Homogeneity is important in achieving consistent polishing pad performance. Accordingly, the reaction mixture of the present invention is chosen so that the resulting pad morphology is stable and easily reproducible. For example, it is often important to control additives such as anti-oxidizing agents, and impurities such as water for consistent manufacturing. Because water reacts with isocyanate to form gaseous carbon dioxide and a weak reaction product relative to urethanes generally, the water concentration can affect the concentration of carbon dioxide bubbles that form pores in the polymeric matrix as well as the overall consistency of the polyurethane reaction product. Isocyanate reaction with adventitious water also reduces the available isocyanate for reacting with chain extender, so changing the stoichiometry along with level of crosslinking (if there is an excess of isocyanate groups) and tends to lower resulting polymer molecular weight. To reduce the variability of water's impact to the polyurethane, the water content in the raw materials in monitored and adjusted to a specific value, from 0 ppm to 1000 ppm; preferably from 50 ppm to 500 ppm.

Preferably, to maintain the stability of the pore structure in the reaction mixture and in the porous polyurethane that makes up the CMP polishing layer or pad of the present invention, the (ii) liquid polyol component comprises up to 2.0 wt. % or, preferably, from 0.1 to 1 wt. %, based on the total solids weight of the reaction mixture, of a nonionic surfactant, preferably, an organopolysiloxane-co-polyether surfactant.

Preferably, to increase the reactivity of the (i) liquid polyol component with the liquid aromatic isocyanate component, a catalyst may be used. Suitable catalysts include any known catalysts to those skilled in the art, for example, oleic acid, azelaic acid, dibutyltindilaurate, tin octoate, bismuth octoate, 1,8-diazabicyclo[5.4.0]undec-7-ene (DBU), tertiary amine catalysts, such as Dabco™ TMR catalyst (Air Products, Allentown, PA), triethylenediamines, such as DABCO™ 33 LV catalyst (Air Products), and mixtures of the above.

The reaction mixture of the present invention is substantially free of water and is free of added organic solvents.

The specific gravity of the resulting CMP polishing pad ranges from 0.9 down to 0.5, preferably. As porosity increases, the bulk properties of the CMP polishing pad diminish, removal rate (RR) goes up; however, in a hard and porous CMP polishing pad planarization efficiency (PE) and defectivity properties are not expected to improve with increased hardness or hard segment material weight fraction.

Porosity is introduced into the pad by spraying and the resulting tensile modulus of the pad is a function of both the intrinsic polymer tensile modulus and the porosity, and increasing porosity acts to reduce the bulk modulus. Typical densities acquired on a two-component spray manufacture platform range from 0.5 g/mL to 0.9 g/mL, and more typically 0.6 g/mL to 0.8 g/mL.

Polishing pad density is as measured according to ASTM D1622-08 (2008). Density is the same as specific gravity.

The CMP polishing pads of the present invention are formed by a spray application method which enables higher throughput and lower cost. Preferably, the target or substrate in the methods of the present invention is a mold wherein the produced CMP polishing pad will have groove pattern directly incorporated in the mold.

The CMP polishing pads of the invention are efficacious for interlayer dielectric (ILD) and inorganic oxide polishing. For purposes of the specification, the removal rate refers to the removal rate as expressed in A/min.

The chemical mechanical polishing pads of the present invention can comprise just a polishing layer of the polyurethane reaction product or the polishing layer stacked on a subpad or sub layer. The polishing pad or, in the case of stacked pads, the polishing layer of the polishing pad of the present invention is useful in both porous and non-porous (or unfilled) configurations.

Preferably, the CMP polishing layer used in the chemical mechanical polishing pad of the present invention has an average thickness of from 500 to 3750 microns (20 to 150 mils), or, more preferably, from 750 to 3150 microns (30 to 125 mils), or, still more preferably, from 1000 to 3000 microns (40 to 120 mils), or, most preferably, from 1250 to 2500 microns (50 to 100 mils).

The chemical mechanical polishing pad of the present invention optionally further comprises at least one additional layer interfaced with the polishing layer. Preferably, the chemical mechanical polishing pad optionally further comprises a compressible subpad or base layer adhered to the polishing layer. The compressible base layer preferably improves conformance of the polishing layer to the surface of the substrate being polished.

The CMP polishing layer of the chemical mechanical polishing pad of the present invention has a polishing surface adapted for polishing the substrate. Preferably, the polishing surface has macrotexture selected from at least one of perforations and grooves. Perforations can extend from the polishing surface part way or all the way through the thickness of the polishing layer.

Preferably, grooves are arranged on the polishing surface such that upon rotation of the chemical mechanical polishing pad during polishing, at least one groove sweeps over the surface of the substrate being polished.

Preferably, the CMP polishing layer of the chemical mechanical polishing pad of the present invention has a polishing surface adapted for polishing the substrate, wherein the polishing surface has a macrotexture comprising a groove pattern formed therein and chosen from curved grooves, linear grooves, perforations and combinations thereof. Preferably, the groove pattern comprises a plurality of grooves. More preferably, the groove pattern is selected from a groove design, such as one selected from the group consisting of concentric grooves (which may be circular or spiral), curved grooves, linear grooves, cross hatch grooves (e.g., arranged as an X-Y grid across the pad surface), other regular designs (e.g., hexagons, triangles), tire tread type patterns, radial, irregular designs (e.g., fractal patterns), and combinations thereof. More preferably, the groove design is selected from the group consisting of random grooves, concentric grooves, spiral grooves, cross-hatched grooves, X-Y grid grooves, hexagonal grooves, triangular grooves, fractal grooves and combinations thereof. The groove profile is preferably selected from rectangular with straight side walls or the groove cross section may be "V" shaped, "U" shaped, saw-tooth, and combinations thereof.

In accordance with the methods of making CMP polishing pads in accordance with the present invention, chemical mechanical polishing pads can be molded with a macrotexture or groove pattern in their polishing surface to promote slurry flow and to remove polishing debris from the pad-wafer interface. Such grooves may be formed in the polishing surface of the polishing pad from the shape of the mold surface, i.e. where the mold has a female topographic version of the macrotexture.

The chemical mechanical polishing pad of the present invention can be used for polishing a substrate selected from at least one of a magnetic substrate, an optical substrate and a semiconductor substrate.

Preferably, the method of polishing a substrate of the present invention, comprises: providing a substrate selected from at least one of a magnetic substrate, an optical substrate and a semiconductor substrate (preferably a semiconductor substrate, such as a semiconductor wafer); providing a chemical mechanical polishing pad according to the present invention; creating dynamic contact between a polishing surface of the polishing layer and the substrate to polish a surface of the substrate; and, conditioning of the polishing surface with an abrasive conditioner.

Conditioning the polishing pad comprises bringing a conditioning disk into contact with the polishing surface either during intermittent breaks in the CMP process when polishing is paused ("ex situ"), or while the CMP process is underway ("in situ"). The conditioning disk has a rough conditioning surface typically comprised of imbedded diamond points that cut microscopic furrows into the pad surface, both abrading and plowing the pad material and renewing the polishing texture. Typically the conditioning disk is rotated in a position that is fixed with respect to the axis of rotation of the polishing pad, and sweeps out an annular conditioning region as the polishing pad is rotated.

EXAMPLES

The present invention will now be described in detail in the following, non-limiting Examples:

Unless otherwise stated all temperatures are room temperature (21-23° C.) and all pressures are atmospheric pressure (~760 mm Hg or 101 kPa).

Notwithstanding other raw materials disclosed below, the following raw materials were used in the Examples:

Ethacure™ 300 curative: Dimethylthiotoluenediamine (DMTDA), an aromatic diamine (Albemarle, Charlotte, NC).

Voranol™ V5055HH polyol: Multifunctional polyether polyol (OH Eq. wt 2000), high molecular weight ethylene oxide capped propylene oxide polyol with functionality=6 having a number average molecular weight, MN, of 12,000 (The Dow Chemical Company, Midland, MI (Dow)).

MDI prepolymer: A linear isocyanate-terminated urethane prepolymer from MDI and the small molecules dipropylene glycol (DPG) and tripropylene glycol (TPG), with ~23 wt. % NCO content and equivalent weight of 182. 100 wt. % of this MDI prepolymer is treated as hard segment.

Niax™ L5345 surfactant: A non-ionic organosilicon surfactant (Momentive, Columbus, OH).

DABCO 33 LV: An amine catalyst (Air Products, Allentown, PA) made from diazobicyclononane (triethylene diamine), DABCO 33 LV is a blend of 33 wt. % triethylene diamine and 67 wt. % dipropylene glycol.

Unilink™ 4200 curative: N,N'-dialkylamino-diphenyl-methane (Dorf Ketal, Stafford, TX).

PTMEG####: Poly(THF) or polytetramethylene glycol, made via the ring-open polymerization of tetrahydrofuran (THF), and sold as PolyTHF™ polyol (BASF, Leverkusen, DE). The number following PTMEG is the average molecular weight as reported by the manufacturer.

DPG: Dipropylene glycol

BDO: 1,4-Butanediol

PG: Monopropylene glycol (Dow product).

AOX1: A benzofuranone-compound, an antioxidant (Milliken product Milliguard AOX-1).

INT1940: A fatty acid surfactant (Axel Plastics product Mold Wiz INT-1940®).

CMP polishing pad properties were evaluated according to the following methods:

All tensile properties were measured in accordance with ASTM D412-06a, "Standard Test Methods for Vulcanized Rubber and Thermoplastic Elastomers—Tension." Samples were cut to dogbone type C dimensions. Unless otherwise indicated, five test specimens were measured and an average of all tested specimens for each analyte sample were reported.

Tensile elongation at break: Means the ratio between changed length after breakage of a test specimen and initial length, and tested in accordance with ASTM D412-06a (2006), "Standard Test Methods for Vulcanized Rubber and Thermoplastic Elastomers—Tension."

In all of the Examples that follow, the indicated two-component reaction mixture was mixed and sprayed onto an open mold using an impingement mixing and air spray system having two tanks (iso tank and poly tank) to feed the mixing system. The two tanks were set at given material flow rates, from which the relative amounts of each of the two components are readily determined. Flow from the two tanks was started and stopped at the same time. CMP polishing pads both in accordance with the present invention and comparatives were formed, as follows:

Comparative Example 1: Plaque and Pad

In a mix cup, 39 parts (97.50 g, 0.0513 eq mol) of an ethylene oxide capped propylene oxide polyol with functionality=6, equiv wt=1900 (Dow product Voranol™ 5055HH) was combined with 1 part (2.50 g) Niax™ L5345 surfactant and 15.47 parts (38.68 g, 0.3615 mol) Ethacure™ 300 liquid aromatic diamine and 1.92 parts (4.80 g, 0.155 eq mol) of monoethylene glycol. To this mixed and degassed liquid, 42.608 parts (106.52 g, 0.5852 eq mol) of a MDI prepolymer was added. The cup was then mixed with a vortex mixer for 30 seconds and then poured into a mold to cast a plaque and cured at 100 C. for 16 hours. Reaction mixture had a 60% hard-segment weight fraction, with 95% (0.95:1) stoichiometry, containing 15.47% liquid aromatic diamine. The mole ratio of liquid aromatic diamine/total moles diamine and polyol in the curative mixture is 70%. After curing, the plaque with density of 1.16 g/mL showed 579 MPa (84,000 psi) tensile modulus, 40.7 MPa (5,900 psi) tensile strength, and 175% tensile elongation at break.

A two-component impingement mixing and air spray system was employed to spray the above reaction mixture into an open mold. The iso tank was loaded with MDI prepolymer, while the poly tank was loaded with 67.60 parts Voranol™ 5055HH (47.32 lbs), 3.33 parts monoethylene glycol (2.33 lbs), 1.73 parts Niax™ L5345 (1.21 lbs), 26.81 parts Ethacure™ 300 (18.77 lbs); identical ratios as used in the plaque work above. The flow rates during spraying were 9.49 g/s for the polyol side and 7.01 g/s for the iso side. The air injected into the nozzle was set to a nominal rate of 100 L/min. The sprayed polyurethane formulation was directed into a mold with groove features. The sprayed pad was cured in a 100° C. oven for 15 min, then removed from the mold and cured in a 100° C. oven for 16 hours. The resulting pads contained both radial and concentric circular grooves. The resulting pads produced displayed an average density of 0.762 g/mL, a bulk tensile modulus of 251.6 MPa (36,500 psi), a tensile strength of 15.2 MPa (2,200 psi), and 65% tensile elongation.

Example 2: Plaque and Pad

In a mix cup, 39.6 parts (99.0 g, 0.0521 eq mol) of an ethylene oxide capped propylene oxide polyol with functionality=6, equiv wt=1900 (Dow product Voranol™ 5055HH) was combined with 1 part (2.50 g) Niax™ L5345 surfactant and 8.33 parts (20.82 g, 0.1946 eq mol) Ethacure™ 300 and 4.48 parts (11.20 g, 0.3613 eq mol) monoethylene glycol. To this mixed and degassed liquid, 46.59 parts (116.48 g, 0.640 eq mol) of MDI prepolymer was added. The cup was then mixed with a vortex mixer for 20 seconds and then poured into a mold to cast a plaque and cured at 100° C. for 16 hours. The formulation is described as having 60% hard-segment weight fraction, with 95% stoichiometry, containing 8.33% Ethacure™ 300. The mole ratio of liquid aromatic diamine/total moles diamine and polyol in the curative mixture is 35%. After curing, the plaque with density of 1.16 g/mL showed 411 MPa (59,600 psi) tensile modulus, 29.0 MPa (4200 psi) tensile strength, and 169% tensile elongation.

A two-component impingement mixing and air spray system was employed to spray the above reaction mixture into an open mold. The iso tank was loaded with MDI prepolymer, while the poly tank was loaded with 73.75 parts Voranol™ 5055HH (58.26 lbs), 8.34 parts monoethylene glycol (6.59 lbs), 1.84 parts Niax™ L5345 (1.461 lbs), 15.51 parts Ethacure™ 300 (12.25 lbs); identical ratios as used in the plaque work above. The flow rates during spraying were 9.10 g/s for the polyol side and 7.90 g/s for the iso side. The air injected into the nozzle was set to a nominal rate of 100 L/min. The sprayed polyurethane formulation was directed into a mold with groove features. The sprayed pad was cured in a 100° C. oven for 15 min, then removed from the mold and cured in a 100° C. oven for 16 hours. The resulting pads contained both radial and concentric circular grooves. The resulting pads produced displayed an average density of 0.813 g/mL and displayed a 15 second Hardness Shore D of 57, a bulk tensile modulus of 291.0 MPa (42,200 psi), a tensile strength of 17.9 MPa (2,600 psi), and 116% tensile elongation.

Comparative Example 3: Plaque and Pad

A blend was prepared of equal parts by weight of poly (tetramethylene glycol) (PTMEG) 650, PTMEG 1000, PTMEG 2000. In a mix cup, 34.65 parts (86.63 g, 0.1754 eq mol) of this blend was combined with 1 part (2.50 g) Niax™ L5345 surfactant and 18.24 parts (45.60 g, 0.4262 eq mol) Ethacure™ 300. To this mixed and degassed liquid, 46.11 parts (115.27 g, 0.6334 eq mol) of MDI prepolymer. The cup was then mixed with a vortex mixer for 20 seconds and then poured into a mold to cast a plaque and cured at 100° C. for 16 hours. The formulation is described as having 65% hard-segment weight fraction, with 95% stoichiometry, containing 18.24 wt. % Ethacure™ 300. The mole ratio of liquid aromatic diamine/total moles diamine and polyol in the curative mixture is 100%. After curing, the plaque with density of 1.16 g/mL displayed a 15 second Shore D hardness of 71, an 554.3 MPa (80,400 psi) tensile modulus, 46.88 MPa (6,800 psi) tensile strength, and 220% tensile elongation.

A two-component impingement mixing and air spray system was employed to spray the above reaction mixture into an open mold. The iso tank was loaded with MDI prepolymer, while the poly tank was loaded with 20.457 parts PTMEG650 (12.60 lbs), 20.457 parts PTMEG1000 (12.60 lbs), 20.457 PTMEG2000 (12.60 lbs), 1.548 parts Niax L5345 (0.954 lbs), 36.616 parts Ethacure 300 (22.55 lbs); identical ratios as used in the plaque work above. The flow rates during spraying were 9.59 g/s for the polyol side and 7.41 g/s for the iso side. The air injected into the nozzle was set to a nominal rate of 100 L/min. The sprayed polyurethane formulation was directed into a mold with groove features. The sprayed pad was cured in a 100° C. oven for 16 hours. The resulting pads contained both radial and concentric circular grooves. The resulting pads produced displayed an average density of 0.791 g/mL and displayed a 15 second Hardness Shore D of 56, a bulk tensile modulus of 277 MPa (40,200 psi), a tensile strength of 17.9 MPa (2,600 psi), and 112% tensile elongation.

Example 4: Plaque and Pad

A blend was prepared of equal parts by weight of poly (tetramethylene glycol) (PTMEG) 650, PTMEG 1000, PTMEG 2000. In a mix cup, 34.65 parts (86.63 g, 0.1754 eq mol) of this blend was combined with 1 part (2.50 g) Niax™ L5345 surfactant and 10.45 parts (26.128 g, 0.2442 eq mol) Ethacure™ 300 and 3.02 parts (7.57 g, 0.2442 eq mol) monoethylene glycol. To this mixed and degassed liquid, 50.87 parts (127.18 g, 0.6988 eq mol) of MDI prepolymer. The cup was then mixed with a vortex mixer for 20 seconds and then poured into a mold to cast a plaque and cured at 100° C. for 16 hours. The formulation is described as having 65% hard-segment weight fraction, with 95% stoichiometry, containing 10.45 wt. % Ethacure™ 300. The mole ratio of liquid aromatic diamine/total moles diamine and polyol in the curative mixture is 50%. After curing, the plaque with density of 1.16 g/mL displayed a 15 second Shore D hardness of 67, a 467.5 MPa (67,800 psi) tensile modulus, 40.0 MPa (5,800 psi) tensile strength, and 230% tensile elongation.

A two-component impingement mixing and air spray system was employed to spray the above reaction mixture into an open mold. The iso tank was loaded with MDI prepolymer, while the poly tank was loaded with 22.62 parts PTMEG650 (16.92 lbs), 22.62 parts PTMEG1000 (16.92 lbs), 22.62 parts PTMEG2000 (16.92 lbs), 1.712 parts Niax™ L5345 (1.281 lbs), 6.72 parts monoethylene glycol (5.025 lbs), 23.195 parts Ethacure™ 300 (17.35 lbs); identical ratios as used in the plaque work above. The flow rates during spraying were 8.67 g/s for the polyol side and 8.33 g/s for the iso side. The air injected into the nozzle was set to a nominal rate of 100 L/min. The sprayed polyurethane formulation was directed into a mold with groove features. The sprayed pad was cured in a 100° C. oven for 16 hours. The resulting pads contained both radial and concentric circular grooves. The resulting pads produced displayed an average density of 0.848 g/mL and displayed a 15 second Hardness Shore D of 58, a bulk tensile modulus of 324.0 MPa (47,000 psi), a tensile strength of 19.3 MPa (2,800 psi), and 197% tensile elongation.

Example 5: Plaque and Pad

A blend was prepared of equal parts by weight of poly (tetramethylene glycol) (PTMEG) 650, PTMEG 1000, PTMEG 2000. In a mix cup, 34.65 parts (86.63 g, 0.1754 eq mol) of this blend was combined with 1 part (2.50 g) Niax™ L5345 surfactant and 7.65 parts (19.13 g, 0.179 eq mol) Ethacure™ 300 and 4.11 parts (10.29 g, 0.332 eq mol) monoethylene glycol. To this mixed and degassed liquid, 52.58 parts (131.46 g, 0.722 eq mol) of MDI prepolymer. The cup was then mixed with a vortex mixer for 20 seconds and then poured into a mold to cast a plaque and cured at 100° C. for 16 hours. The formulation is described as having 65% hard-segment weight fraction, with 95% stoichiometry, containing 7.65 wt. % Ethacure™ 300. The mole ratio of liquid aromatic diamine/total moles diamine and polyol in the curative mixture is 35%. After curing, the plaque with density of 1.16 g/mL displayed a 15 second Shore D hardness of 66, a 411.6 MPa (59,700 psi) tensile modulus, 39.3 MPa (5,700 psi) tensile strength, and 290% tensile elongation.

A two-component impingement mixing and air spray system was employed to spray the above reaction mixture into an open mold. The iso tank was loaded with MDI prepolymer, while the poly tank was loaded with 24.22 parts PTMEG650 (13.92 lbs), 24.22 parts PTMEG1000 (13.92 lbs), 24.22 parts PTMEG2000 (13.92 lbs), 2.10 parts Niax™ L5345 (1.20 lbs), 8.63 parts monoethylene glycol (4.96 lbs), 16.05 parts Ethacure™ 300 (9.225 lbs), 0.43 parts (0.246 lbs) DABCO™ 33-LV catalyst and 0.142 parts (0.082 lbs) bismuth neodecanoate catalyst; identical ratios as used in the plaque work above. The flow rates during spraying were 8.98 g/s for the polyol side and 10.02 g/s for the iso side. The air injected into the nozzle was set to a nominal rate of 100 L/min. The sprayed polyurethane formulation was directed into a mold with groove features. The sprayed pad was cured in a 100° C. oven for 16 hours. The resulting pads contained both radial and concentric circular grooves. The resulting pads produced displayed an average density of 0.650 g/mL and displayed a 15 second Hardness Shore D of 47.6, a bulk tensile modulus of 226.8 MPa (32,900 psi), a tensile strength of 18.6 MPa (2,700 psi), and 190% tensile elongation.

Example 6: Pad

A two-component impingement mixing and air spray system was employed to spray a reaction mixture into an open mold. The iso tank was loaded with MDI prepolymer, while the poly tank was loaded with 25.13 parts PTMEG650 (17.97 lbs), 25.13 parts PTMEG1000 (17.97 lbs), 25.13 parts PTMEG2000 (17.97 lbs), 1.90 parts Niax™ L5345 (1.36 lbs), 4.988 parts monoethylene glycol (3.57 lbs), 17.21 parts Ethacure™ 300 (12.31 lbs), 0.381 parts DABCO™ 33-LV catalyst (0.273 lbs) and 0.127 parts bismuth neodecanoate catalyst (0.091 lbs). The flow rates during spraying were 9.90 g/s for the polyol side and 9.10 g/s for the iso side. The formulation is described as having 60% hard-segment weight fraction, with 95% stoichiometry, containing 9.02 wt. % Ethacure™ 300. The mole ratio of liquid aromatic diamine/total moles diamine and polyol in the curative mixture is 50%. The air injected into the nozzle was set to a nominal rate of 100 L/min. The sprayed polyurethane formulation was directed into a mold with groove features. The sprayed pad was cured in a 100° C. oven for 16 hours. The resulting pads contained both radial and concentric circular grooves. The resulting pads produced displayed an average density of 0.704 g/mL and displayed a 15 second Hardness Shore D of 40, a bulk tensile modulus of 137.2 MPa (19,900 psi), a tensile strength of 17.9 MPa (2,600 psi), and 260% tensile elongation.

Example 7: Pad

A two-component impingement mixing and air spray system was employed to spray a reaction mixture into an open mold. The iso tank was loaded with MDI prepolymer, while the poly tank was loaded with 26.13 parts PTMEG650 (21.20 lbs), 26.13 parts PTMEG1000 (21.20 lbs), 26.13 parts PTMEG2000 (21.20 lbs), 1.98 parts Niax™ L5345 (1.60 lbs), 7.70 parts monoethylene glycol (6.25 lbs), 11.40 parts Ethacure™ 300 (9.25 lbs), 0.397 parts DABCO™ 33-LV catalyst (0.322 lbs) and 0.132 parts bismuth neodecanoate catalyst (0.107 lbs). The flow rates during spraying were 9.52 g/s for the polyol side and 9.48 g/s for the iso side. The formulation is described as having 60% hard-segment weight fraction, with 95% stoichiometry, containing 5.75 wt. % Ethacure™ 300. The mole ratio of liquid aromatic diamine/total moles diamine and polyol in the curative mixture is 30%. The air injected into the nozzle was set to a nominal rate of 100 L/min. The sprayed polyurethane formulation was directed into a mold with groove features. The sprayed pad was cured in a 100° C. oven for 16 hours. The resulting pads contained both radial and concentric circular grooves. The resulting pads produced displayed an average density of 0.711 g/mL and displayed a 15 second Hardness Shore D of 39, a bulk tensile modulus of 117.9 MPa (17,100 psi), a tensile strength of 16.5 MPa (2,400 psi), and 260% tensile elongation.

Comparative Example 8: Pad

A two-component impingement mixing and air spray system was employed to spray a reaction mixture into an open mold. The iso tank was loaded with MDI prepolymer, while the poly tank was loaded with 87.99 parts Poly-THF650 (61.593 lbs), 0.88 parts Niax™ L5345 (0.616 lbs) non-ionic surfactant, 0.088 parts Niax™ T-9 catalyst (0.062 lbs), 0.2642 parts DABCO™ 33LV (0.185 lbs) and 0.22 parts of water (0.154 lbs) and 10.557 parts of dipropylene glycol (7.39 lbs). The flow rates during spraying were 9.10 g/s for the polyol side and 9.90 g/s for the iso side. The air injected into the nozzle was set to a nominal rate of 100 L/min. The sprayed polyurethane formulation was directed onto a Teflon-coated aluminum plate. The sprayed pad was cured in a 100° C. oven for 16 hours. The resulting pad is described as 52.5% hard-segment weight fraction at 95% stoichiometry and with 2500 ppm water added produced a pad with bulk density of 0.53 g/mL and displayed a bulk tensile modulus of 1.2 MPa (170 psi), tensile strength of 6.0 MPa (870 psi), and 535% tensile elongation, the 15 second Shore A Hardness was 27.

Comparative Example 9

Commercial IC1000 polishing pad (Dow) with identical K7R32 groove pattern and identical SUBA™IV subpad (Dow) as used in other polishing experiments. The density was 0.77 g/mL and tensile modulus was 260 MPa (37,700 psi).

Example 10: Pad

A two-component impingement mixing and air spray system was employed to spray a reaction mixture into an open mold. The iso tank was loaded with MDI prepolymer, while the poly tank was loaded with 84.85 parts PTMEG1000, 3.48 parts of INT1940, 0.24 parts of AOX1, 4.46 parts monoethylene glycol, 6.59 parts Ethacure™ 300, 0.38 parts bismuth octoate catalyst. The flow rates during spraying were 4.6 g/s for the polyol side and 3.4 g/s for the iso side. The formulation is described as having 50% hard-segment weight fraction, with 95% stoichiometry, containing 3.79 wt. % Ethacure™ 300. The mole ratio of liquid aromatic diamine/total moles diamine and polyol in the curative mixture is 30%. The air injected into the nozzle was set to a nominal rate of 100 L/min. The sprayed polyurethane formulation was directed into a mold with groove features. The sprayed pad was cured in a 100° C. oven for 16 hours. The resulting pads contained both radial and concentric circular grooves. The resulting pads produced displayed an average density of 0.68 g/mL and displayed a 15 second Hardness Shore DO of 32, a bulk tensile modulus of 4 MPa (600 psi), a tensile strength of 11 MPa (1500 psi), and 550% tensile elongation.

Example 11: Pad

A two-component impingement mixing and air spray system was employed to spray a reaction mixture into an open mold. The iso tank was loaded with MDI prepolymer, while the poly tank was loaded with 81.96 parts PTMEG1000, 3.65 parts of INT1940, 0.26 parts of AOX1, 5.54 parts monoethylene glycol, 8.2 parts Ethacure™ 300, 0.4 parts bismuth octoate catalyst. The flow rates during spraying were 4.6 g/s for the polyol side and 3.8 g/s for the iso side. The formulation is described as having 54% hard-segment weight fraction, with 95% stoichiometry, containing 4.49 wt. % Ethacure™ 300. The mole ratio of liquid aromatic diamine/total moles diamine and polyol in the curative mixture is 30%. The air injected into the nozzle was set to a nominal rate of 100 L/min. The sprayed polyurethane formulation was directed into a mold with groove features. The sprayed pad was cured in a 100° C. oven for 16 hours. The resulting pads contained both radial and concentric circular grooves. The resulting pads produced displayed an average density of 0.70 g/mL and displayed a 15 second Hardness Shore DO of 49, a bulk tensile modulus of 12 MPa (1700 psi), a tensile strength of 15 MPa (2100 psi), and 500% tensile elongation.

Example 12: Pad

A two-component impingement mixing and air spray system was employed to spray a reaction mixture into an open mold. The iso tank was loaded with MDI prepolymer, while the poly tank was loaded with 79.8 parts PTMEG1000, 3.55 parts of INT1940, 0.25 parts of AOX1, 6.46 parts monoethylene glycol, 9.55 parts Ethacure™ 300, 0.39 parts bismuth octoate catalyst. The flow rates during spraying were 4.6 g/s for the polyol side and 3.6 g/s for the iso side. The formulation is described as having 54% hard-segment weight fraction, with 110% stoichiometry, containing 5.38 wt. % Ethacure™ 300. The mole ratio of liquid aromatic diamine/total moles diamine and polyol in the curative mixture is 30%. The air injected into the nozzle was set to a nominal rate of 100 L/min. The sprayed polyurethane formulation was directed into a mold with groove features. The sprayed pad was cured in a 100° C. oven for 16 hours. The resulting pads contained both radial and concentric circular grooves. The resulting pads displayed an average density of 0.73 g/mL and displayed a 15 second Hardness Shore DO of 43, a bulk tensile modulus of 8 MPa (1200 psi), a tensile strength of 8 MPa (1200 psi), and 530% tensile elongation.

Example 13: Pad

A two-component impingement mixing and air spray system was employed to spray a reaction mixture into an open mold. The iso tank was loaded with MDI prepolymer, while the poly tank was loaded with 77.32 parts PTMEG1000, 3.68 parts of INT1940, 0.26 parts of AOX1, 7.39 parts monoethylene glycol, 10.94 parts Ethacure™ 300, 0.41 parts bismuth octoate catalyst. The flow rates during spraying were 4.6 g/s for the polyol side and 3.9 g/s for the iso side. The formulation is described as having 57% hard-segment weight fraction, with 110% stoichiometry, containing 5.94 wt. % Ethacure™ 300. The mole ratio of liquid aromatic diamine/total moles diamine and polyol in the curative mixture is 30%. The air injected into the nozzle was set to a nominal rate of 100 L/min. The sprayed polyurethane formulation was directed into a mold with groove features.

The sprayed pad was cured in a 100° C. oven for 16 hours. The resulting pads contained both radial and concentric circular grooves. The resulting pads produced displayed an average density of 0.74 g/mL and displayed a 15 second Hardness Shore DO of 56, a bulk tensile modulus of 21 MPa (3100 psi), a tensile strength of 3 MPa (500 psi), and 85% tensile elongation.

Example 14: Pad

A two-component impingement mixing and air spray system was employed to spray a reaction mixture into an open mold. The iso tank was loaded with MDI prepolymer, while the poly tank was loaded with 24.6 parts PTMEG650, 24.6 parts PTMEG1000, 24.6 parts PTMEG2000, 1.87 parts Niax™ L5345, 14.23 parts dipropylene glycol, 9.73 parts Ethacure™ 300, 0.37 parts bismuth neodecanoate catalyst. The flow rates during spraying were 10.4 g/s for the polyol side and 9.1 g/s for the iso side. The formulation is described as having 60% hard-segment weight fraction, with 95% stoichiometry, containing 5.21 wt. % Ethacure™ 300. The mole ratio of liquid aromatic diamine/total moles diamine and polyol in the curative mixture is 30%. The air injected into the nozzle was set to a nominal rate of 100 L/min. The sprayed polyurethane formulation was directed into a mold with groove features. The sprayed pad was cured in a 100° C. oven for 16 hours. The resulting pads contained both radial and concentric circular grooves. The resulting pads produced displayed an average density of 0.45 g/mL and displayed a 15 second Hardness Shore D of 14, a bulk tensile modulus of 27 MPa (3900 psi), a tensile strength of 7 MPa (1100 psi), and 300% tensile elongation Example 15: Pad A two-component impingement mixing and air spray system was employed to spray a reaction mixture into an open mold. The iso tank was loaded with MDI prepolymer, while the poly tank was loaded with 25.49 parts PTMEG650, 25.49 parts PTMEG1000, 25.49 parts PTMEG2000, 1.94 parts Niax™ L5345, 10.51 parts 1,4-butanediol, 10.7 parts Ethacure™ 300, 0.39 parts bismuth neodecanoate catalyst. The flow rates during spraying were 10.1 g/s for the polyol side and 9.4 g/s for the iso side. The formulation is described as having 60% hard-segment weight fraction, with 95% stoichiometry, containing 5.53 wt. % Ethacure™ 300. The mole ratio of liquid aromatic diamine/total moles diamine and polyol in the curative mixture is 30%. The air injected into the nozzle was set to a nominal rate of 100 L/min. The sprayed polyurethane formulation was directed into a mold with groove features. The sprayed pad was cured in a 100° C. oven for 16 hours. The resulting pads contained both radial and concentric circular grooves. The resulting pads produced displayed an average density of 0.66 g/mL and displayed a 15 second Hardness Shore D of 29, a bulk tensile modulus of 64 MPa (9300 psi), a tensile strength of 13 MPa (1900 psi), and 260% tensile elongation Example 16: Pad A two-component impingement mixing and air spray system was employed to spray a reaction mixture into an open mold. The iso tank was loaded with MDI prepolymer, while the poly tank was loaded with 80.26 parts PTMEG1000, 1.91 parts Niax™ L5345, 8.01 parts propyleneglycol, 9.54 parts Ethacure™ 300, 0.28 parts bismuth neodecanoate catalyst. The flow rates during spraying were 11.1 g/s for the polyol side and 9.9 g/s for the iso side. The formulation is described as having 57% hard-segment weight fraction, with 95% stoichiometry, containing 5.05 wt. % Ethacure™ 300. The mole ratio of liquid aromatic diamine/total moles diamine and polyol in the curative mixture is 30%. The air injected into the nozzle was set to a nominal rate of 100 L/min. The sprayed polyurethane formulation was directed into a mold with groove features. The sprayed pad was cured in a 100° C. oven for 16 hours. The resulting pads contained both radial and concentric circular grooves. The resulting pads produced displayed an average density of 0.69 g/mL and displayed a 15 second Hardness Shore D of 36, a bulk tensile modulus of 81 MPa (11700 psi), a tensile strength of 16 MPa (2300 psi), and 280% tensile elongation.

The properties of the materials and pads in the Examples, above, are reported in Table 1, below. The pads made in the Examples, above, were tested for polishing as set forth in the test methods, below, and the results are reported in each of Tables 1 and 2, below.

CMP polishing pads were produced by machining the backside of the indicated polishing layers made in the above examples flat on a lathe to provide a flat polishing pad. The polishing pad was then mated to a SUBA™ IV subpad (Dow) via pressure sensitive adhesive. The final stacked pad was 0.508 meters (20") in diameter wherein the polishing layer was nominally 2.03 mm (80 mil) thick and featured a groove pattern wherein the plurality of grooves featured a concentric circle groove pattern with concentric circular grooves 0.508 mm (20 mil) wide, 0.762 mm (30 mil) deep, 1.78 mm (70 mil) pitch and 32 radial grooves. Polishing experiments were performed on 200 mm wafers on an Applied Mirra polisher (Applied Materials, Santa Clara, CA) with a carrier downforce of 0.014, 0.016, 0.021, and 0.026 MPa (2.0, 2.3, 3.0, and 3.8 psi), a slurry flow rate of 200 mL/min and a Klebosol™ 111730 colloidal silica slurry (Dow, 16 wt. % solids), a table rotation speed of 93 rpm and a carrier rotation speed of 87 rpm. A 3M™ Diamond Pad Conditioner A153L, 4.25 inch Diameter with aggressiveness rating from 3M of 6-9 (The 3M Company, Minneapolis, MN) was used to condition and texture the polishing pads, for examples 1 to 9, 14 and 15. A Saesol Diamond Pad Conditioner AK45 (Saesol™ AM02BSL8031C1) was used to condition and texture the polishing pads for example 16. A Saesol Diamond Pad Conditioner AD45 (Saesol™ AM02BSL8031E7) was used to condition and texture the polishing pads for examples 10 to 13. The polishing pads were each broken in with the conditioner and DI water only using a typical down force, e.g., 22.2 N or 31.1 N, for 30 min. The polishing pads were further conditioned 100% in situ during polishing at 10 sweeps/min from 1.7 to 9.2 in from the center of the polishing pad with a down force of 22.2 N. The wafers were cleaned on a OnTrack DSS-200 Synergy Post CMP cleaner. To further highlight shallow scratches an HF etch was performed on an SSEC single wafer etch system whereby 200 Ang of TEOS was etched from the wafer. Step heights for planarization measurements were performed on a Bruker Dynamic Atomic Force Profiler (Bruker, Billerica, MA). The substrate was a tetraethoxysilicate (TEOS) wafer substrate. The removal rates were determined by measuring the film thickness before and after polishing using a KLA-Tencor FX200™ metrology tool (KLA Tencor, Milpitas, CA) using a 49 point spiral scan with a 3 mm edge exclusion. Removal rate was calculated by the change in thickness in the individual points for the designated polishing time, in Angstroms/min. Non-Uniformity Ratio (% NUR) was calculated by % standard deviation of the removal rates.

TABLE 1

Pad Performance and Properties

| Example | HS-WF (wt. %) | mol % diamine in Curative* | Wt. % diamine in formulation | Density (g/mL) | TEOS Removal Rate (Å/min at 0.02 MPa) | % NUR | % PE @50-PD[1] |
|---|---|---|---|---|---|---|---|
| CE1-plaque | 60 | 70 | 15.47 | 1.16 | | | |
| CE1-pad | 60 | 70 | 15.47 | 0.762 | 2525 | 10% | 0.766 |
| 2-plaque | 60 | 35 | 8.33 | 1.16 | | | |
| 2-pad | 60 | 35 | 8.33 | 0.813 | 2400 | 6% | 0.889 |
| CE3-plaque | 65 | 100 | 18.24 | 1.16 | | | |
| CE3-pad | 65 | 100 | 18.24 | 0.791 | 2450 | 7.5% | 0.793 |
| 4-plaque | 65 | 50 | 10.45 | 1.16 | | | |
| 4-pad | 65 | 50 | 10.45 | 0.848 | 2600 | 6% | 0.880 |
| 5-plaque | 65 | 35 | 7.65 | 1.16 | | | |
| 5-pad | 65 | 35 | 7.65 | 0.650 | 2425 | 5.5% | 0.824 |
| 6-pad | 60 | 50 | 9.02 | 0.704 | 2525 | 7.5% | 0.849 |
| 7-pad | 60 | 30 | 5.75 | 0.711 | 2560 | 8.0% | 0.864 |
| CE8-pad | 52.5 | 0 | 0 | 0.53 | | | 0.450 |
| CE9 pad-IC1000 | NA | NA | NA | 0.77 | 2600 | 7.0% | 0.798 |
| 10-pad | 50 | 30 | 3.79 | 0.68 | 1600 | 10.7% | 0.802 |
| 11-pad | 54 | 30 | 4.49 | 0.70 | 1900 | 7% | 0.896 |
| 12-pad | 54 | 30 | 5.38 | 0.73 | 1700 | 4% | 0.908 |
| 13-pad | 57 | 30 | 5.94 | 0.74 | 2000 | 11.2% | 0.923 |
| 14-pad | 60 | 30 | 5.21 | 0.45 | 2400 | 8% | 0.918 |
| 15-pad | 60 | 30 | 5.53 | 0.66 | 2600 | 7.6% | 0.819 |
| 16-pad | 57 | 30 | 5.05 | 0.685 | 2500 | 8% | 0.741 |

*defined as (moles diamine)/(moles of diamine + small chain polyol);
[1]PD: Pattern density.

TABLE 2

Pad Performance Properties

| Example | HSWF (wt. %) | mol % diamine in Curative* | Wt. % diamine in formulation | Tensile Modulus (MPa) | Tensile Strength (MPa) | Tensile Elongation (%) |
|---|---|---|---|---|---|---|
| CE1-plaque | 60 | 70 | 15.47 | 579 | 40.7 | 175 |
| CE1-pad | 60 | 70 | 15.47 | 251.6 | 15.2 | 65 |
| 2-plaque | 60 | 35 | 8.33 | 411 | 29 | 169 |
| 2-pad | 60 | 35 | 8.33 | 291 | 17.9 | 116 |
| CE3-plaque | 65 | 100 | 18.24 | 554.3 | 46.88 | 220 |
| CE3-pad | 65 | 100 | 18.24 | 277 | 17.9 | 112 |
| 4-plaque | 65 | 50 | 10.45 | 467.5 | 40.0 | 230 |
| 4-pad | 65 | 50 | 10.45 | 324 | 19.3 | 197 |
| 5-plaque | 65 | 35 | 7.65 | 411.6 | 39.3 | 290 |
| 5-pad | 65 | 35 | 7.65 | 226.8 | 18.6 | 190 |
| 6-pad | 60 | 50 | 9.02 | 137.2 | 17.9 | 260 |
| 7-pad | 60 | 30 | 5.75 | 117.9 | 16.5 | 260 |
| CE8-pad | 52.5 | 0 | 0 | 1.2 | 6.0 | 535 |
| CE9 pad-IC1000 | NA | NA | NA | 260 | NA | NA |
| 10-pad | 50 | 30 | 3.79 | 4 | 11 | 550 |
| 11-pad | 54 | 30 | 4.49 | 12 | 15 | 502 |
| 12-pad | 54 | 30 | 5.38 | 8 | 8 | 528 |
| 13-pad | 57 | 30 | 5.94 | 21 | 3 | 84 |
| 14-pad | 60 | 30 | 5.21 | 27 | 7 | 300 |
| 15-pad | 60 | 30 | 5.53 | 64 | 13 | 260 |
| 16-pad | 57 | 30 | 5.05 | 81 | 16 | 280 |

*defined as (moles diamine)/(moles of diamine + small chain polyol).

As shown in the above Tables 1 and 2, the CMP polishing pads of the present invention exhibit improved planarization efficiency even when compared to the commercial CMP polishing pad of Comparative Example 10. At the same time, the removal rates and % non-uniformity were the same or similar to the values generated by the IC1000 pad (Dow) of Comparative Example 10. Furthermore, the performance of the inventive CMP polishing pads was significantly better than pads from a liquid aromatic diamine curative in Comparative Example 3 and pads from a 70% liquid aromatic diamine in the curative mixture as in Comparative Example 1.

We claim:

1. A chemical mechanical (CMP) polishing pad for polishing a substrate chosen from at least one of a magnetic substrate, an optical substrate and a semiconductor substrate, the CMP polishing pad comprising a polishing layer adapted for polishing the substrate, the polishing layer being a polyurethane, the polyurethane is a product of a reaction mixture comprising (i) a liquid aromatic isocyanate component comprising one or more aromatic diisocyanates or a linear aromatic isocyanate-terminated urethane prepolymer having an unreacted isocyanate (NCO) concentration of from 20 to 40 wt. %, based on the total solids weight of the liquid aromatic isocyanate component, and (ii) a liquid polyol component comprising a) one or more polymeric polyols, and b) from 12 to 40 wt. %, based on the total weight of the liquid polyol component, of a curative mixture of one or more small chain difunctional polyols having from 2 to 9 carbon atoms, and a liquid aromatic diamine which is a liquid under ambient conditions, wherein the mole ratio of liquid aromatic diamine to the total moles of small chain difunctional polyols and liquid aromatic diamine ranges from 15:85 to 40:60, the reaction mixture comprises 48 to 68 wt. % of hard segment materials, based on the total weight of the reaction mixture, and, yet still further wherein, the CMP polishing layer has a hardness in the range of from 50 Shore A (15 Second) to 68 Shore D (15 second), and a density of from 0.45 to 0.9 g/mL.

2. The CMP polishing pad as claimed in claim 1, wherein the (i) liquid aromatic isocyanate component comprises a linear methylene diphenyl diisocyanate (MDI) prepolymer or MDI.

3. The CMP polishing pad as claimed in claim 1, wherein the (ii) liquid polyol component comprises a) one or more polymeric polyols which is selected from the group consisting of polytetramethylene glycol (PTMEG), polypropylene glycol (PPG), a hexafunctional polyol, and mixtures thereof.

4. The CMP polishing pad as claimed in claim 1, wherein in the b) curative mixture of the (ii) liquid polyol component, the one or more small chain difunctional polyols having from 2 to 9 carbon atoms is selected from the group consisting of ethylene glycol, 1,2-propylene glycol, 1,3-propylene glycol, 1,2-butanediol, 1,3-butanediol, 2-methyl-1, 3-propanediol, 1,4-butanediol, neopentyl glycol, 1,5-pentanediol, 3-methyl-1,5-pentanediol, 1,6-hexanediol, diethylene glycol, dipropylene glycol, tripropylene glycol, and mixtures thereof.

5. The CMP polishing pad as claimed in claim 1, wherein in the b) curative mixture, the liquid aromatic diamine is selected from the group consisting of dimethylthio-toluene diamines, diethyl toluene diamines, tert-butyl toluene diamines, chlorotoluenediamines, N,N'-dialkylaminodiphenylmethane, and mixtures thereof.

6. The CMP polishing pad as claimed in claim 1, wherein in the b) curative mixture, the mole ratio of liquid aromatic diamine to the total moles of small chain difunctional polyols and liquid aromatic diamine ranges from 23:77 to 35:65.

7. The CMP polishing pad as claimed in claim 1, wherein reaction mixture comprises from 58 to 63 wt. % of hard segment materials, based on the total weight of the reaction mixture.

8. The CMP polishing pad as claimed in claim 1, wherein the CMP polishing pad contains no microelements other than those formed by gas, water or $CO_2$-amine adduct.

9. A method for making chemical mechanical (CMP) polishing pads having a polishing layer adapted for polishing a substrate comprising providing the two component reaction mixture as claimed in claim 1, comprising:
provided the two component reaction mixture, including in the ii) liquid polyol component c) water or $CO_2$-amine adduct sufficient to create the density of the CMP polishing pad or layer, mixing the (i) liquid aromatic isocyanate component and the (ii) liquid polyol component, and applying the reaction mixture as one component to an open mold surface; curing the reaction mixture at from ambient temperature to 130° C. to form a molded polyurethane reaction product; removing the polyurethane reaction product from the mold; and, then, finally curing at a temperature from 60 to 130° C. for a period of 1 minutes to 18 hours to form the polishing layer.

10. The method as claimed in claim 9, wherein the mold surface has a male topography that forms a female groove pattern in the top surface of the CMP polishing layer.

\* \* \* \* \*